United States Patent
Yasukawa

(10) Patent No.: US 10,154,156 B2
(45) Date of Patent: Dec. 11, 2018

(54) IMAGE FORMING APPARATUS AND METHOD FOR CONTROLLING IMAGE FORMING APPARATUS

(71) Applicant: CANON KABUSHIKI KAISHA, Tokyo (JP)

(72) Inventor: Takuma Yasukawa, Kashiwa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/956,041

(22) Filed: Apr. 18, 2018

(65) Prior Publication Data

US 2018/0234557 A1 Aug. 16, 2018

Related U.S. Application Data

(62) Division of application No. 14/790,097, filed on Jul. 2, 2015, now Pat. No. 9,979,838.

(30) Foreign Application Priority Data

Jul. 7, 2014 (JP) .................. 2014-139805

(51) Int. Cl.
*H04N 1/00* (2006.01)
*G11C 11/406* (2006.01)
(Continued)

(52) U.S. Cl.
CPC ....... *H04N 1/00084* (2013.01); *G06F 3/0607* (2013.01); *G06F 3/0644* (2013.01);
(Continued)

(58) Field of Classification Search
None
See application file for complete search history.

(56) References Cited

U.S. PATENT DOCUMENTS 5,269,018 A * 12/1993 Lee .................... G11B 20/1252
   360/72.1
5,467,449 A * 11/1995 Gauronski ......... H04N 1/32646
   399/42
(Continued)

FOREIGN PATENT DOCUMENTS

CN   1747036 A   3/2006
CN   101075210 A   11/2007
(Continued)

OTHER PUBLICATIONS

Chinese Office Action issued in corresponding Chinese Application No. 201510390675.6 dated Jul. 31, 2017.
(Continued)

*Primary Examiner* — Pawandeep Dhingra
(74) *Attorney, Agent, or Firm* — Fitzpatrick, Cella, Harper & Scinto

(57) ABSTRACT

An image forming apparatus including: a hard disk configured to store data; a hard disk malfunction detecting unit configured to detect malfunction of the hard disk; a partition confirmation unit configured to determine as to whether a malfunctioning portion of the hard disk is in a preliminary determined partition; and a partition formatting unit configured to format the partition, wherein, when the malfunctioning portion of the hard disk detected by the hard disk malfunction detecting unit is determined as being in the partition preliminary determined by the partition confirmation unit, the partition formatting unit formats the partition.

12 Claims, 4 Drawing Sheets

(51) Int. Cl.
*G06F 3/06* (2006.01)
*G06F 12/06* (2006.01)

(52) U.S. Cl.
CPC ........ *G06F 3/0685* (2013.01); *G06F 12/0638* (2013.01); *G11C 11/40615* (2013.01); *H04N 1/0005* (2013.01); *H04N 1/00007* (2013.01); *H04N 1/0009* (2013.01); *H04N 1/00029* (2013.01); *G06F 2212/205* (2013.01); *H04N 2201/0094* (2013.01)

(56) References Cited

U.S. PATENT DOCUMENTS

| | | | | |
|---|---|---|---|---|
| 7,380,132 | B2* | 5/2008 | Sako | G11B 20/00086 380/200 |
| 7,536,598 | B2* | 5/2009 | Largman | G06F 11/1417 714/13 |
| 8,819,563 | B2* | 8/2014 | Hass | G06F 3/0622 715/741 |
| 9,026,499 | B1* | 5/2015 | Rajimwale | G06F 17/30893 707/674 |
| 2001/0002479 | A1* | 5/2001 | Asoh | G06Q 20/341 711/115 |
| 2002/0124213 | A1* | 9/2002 | Ahrens, Jr. | G06F 11/0712 714/57 |
| 2006/0013093 | A1* | 1/2006 | Tatsuda | G11B 27/30 369/53.1 |
| 2006/0294331 | A1* | 12/2006 | Forrer, Jr. | G06F 12/1466 711/163 |
| 2007/0143591 | A1* | 6/2007 | Dellacona | G06F 11/1417 713/2 |
| 2008/0137126 | A1* | 6/2008 | Yoshida | G06K 15/02 358/1.14 |
| 2010/0031246 | A1* | 2/2010 | Meller | G06F 8/654 717/173 |
| 2010/0122047 | A1* | 5/2010 | Vasilievna | G06F 3/0623 711/155 |
| 2010/0169540 | A1* | 7/2010 | Sinclair | G06F 12/0246 711/103 |
| 2010/0293439 | A1* | 11/2010 | Flynn | G06F 11/073 714/763 |
| 2012/0198289 | A1* | 8/2012 | Hostetter | G11B 5/00821 714/54 |
| 2012/0300260 | A1* | 11/2012 | Takizawa | G03G 15/50 358/1.16 |
| 2013/0013978 | A1* | 1/2013 | Asnaashari | G06F 11/1012 714/763 |
| 2014/0122329 | A1* | 5/2014 | Naggar | G06Q 20/3552 705/41 |

FOREIGN PATENT DOCUMENTS

| | | |
|---|---|---|
| CN | 102135926 A | 7/2011 |
| DE | 69125677 T2 | 11/1997 |
| JP | 2004206291 A | 7/2004 |
| JP | 2004287955 A | 10/2004 |
| JP | 2006033239 A | 2/2006 |
| JP | 2011051258 A | 3/2011 |
| JP | 2012059205 A | 3/2012 |

OTHER PUBLICATIONS

Office Action issued in corresponding German Patent Application No. 102015110849.6 dated Apr. 4, 2017.

* cited by examiner

△ PLEASE RE-POWER ON MAIN POWER SOURCE SWITCH AT
   RIGHT SIDE OF MAIN BODY

· WHEN NORMAL OPERATION IS NOT PERFORMED
  EVEN BY THE ABOVE OPERATION, PLEASE CONTACT
  SERVICE STAFF IN CHARGE.

E00602-0811

401

IMAGE FORMING APPARATUS AND METHOD FOR CONTROLLING IMAGE FORMING APPARATUS

CROSS-REFERENCE TO RELATED APPLICATION

This application is a divisional of U.S. patent application Ser. No. 14/790,097, filed Jul. 2, 2015, which claims priority to Japanese Patent Application No. 2014-139805, filed Jul. 7, 2014, both of which are herein incorporated by reference.

BACKGROUND OF THE INVENTION

Field of the Invention

The present invention relates to an image forming apparatus and a method for controlling the image forming apparatus, and particularly relates to a technology which is suitable when being used when an error due to hard disk abnormality has occurred.

Description of the Related Art

Conventionally, there are some image forming apparatuses which are provided with a hard disk as a storage apparatus that holds the image data and application data of a user, and temporary data during processing therein. The hard disk abnormality includes physical abnormality such as a poor connection of a cable, and logical abnormality due to an off-track error in which a read-write position of the hard disk is shifted due to vibration, and to the unintentional shutdown of a power source during writing.

When having detected the abnormality of the hard disk, the image forming apparatus notifies an UI or a remote monitoring system of the error, and requests the dispatch of a serviceman. Then, the serviceman turns a power source on again, or formats a region (partition) of the hard disk, which is considered to have abnormality. The serviceman performs the replacement of the hard disk, as a countermeasure at the time when the above methods could not resolve the error. Here, the serviceman is a person who saves the image forming apparatus. Incidentally, the serviceman is a worker who is assumed to have a technical knowledge concerning the image forming apparatus in his charge, and solves a failure and the like when the failure has occurred.

In reality, the error is often an error which has been notified mainly because of the logical abnormality of the hard disk due to a malfunction of a software, such as an abnormality in the partition and the destruction of a file system. In this case, the dispatched serviceman can resolve the error only by turning the power source on again or formatting the partition. A technology of automatically performing the format when the image forming apparatus detected the abnormality is proposed as a method for resolving these logical abnormalities of the hard disk (Japanese Patent Application Laid-Open No. 2006-33239).

On the other hand, also in the case of the physical abnormality of the hard disk, the hard disk is occasionally temporarily restored by the format of the partition, and the serviceman takes a countermeasure of: restoring the hard disk by formatting when having been firstly dispatched; and replacing the hard disk when having been notified of the error again.

However, when automatically formatting the partition without obtaining a consent of the user, the serviceman results in deleting the image data and application data of the user without permission from the user.

In addition, even though the error is caused by the physical abnormality of the hard disk, there is the case where the hard disk is temporarily restored by the format. For this reason, there is the case where the serviceman results in finishing the work without replacing the hard disk when having been dispatched firstly, and cannot appropriately take measures against the physical abnormality of the hard disk. In this case, there is such a problem that the hard disk results in operating in a state of having held the risk of losing the data of the user.

SUMMARY OF THE INVENTION

The present invention is designed with respect to the above described problems, and an object is to enable the cost of the dispatch of the serviceman for the logical abnormality of the hard disk which can be restored by a simple countermeasure to be reduced, and to enable a risk of losing the data of the user to be appropriately resolved.

According to an aspect of the present invention, an image forming apparatus comprises: a hard disk configured to store data; a hard disk malfunction detecting unit configured to detect malfunction of the hard disk; a partition confirmation unit configured to determine as to whether a malfunctioning portion of the hard disk is in a partition preliminary determined partition; and a partition formatting unit configured to format the partition, wherein, when the malfunctioning portion of the hard disk detected by the hard disk malfunction detecting unit is determined as being in the partition preliminary determined by the partition confirmation unit, the partition formatting unit formats the partition.

According to the present invention, the number of a dispatch of a serviceman can be reduced, which is requested when a hard disk error has occurred that can be restored by the repower-up of a power source or the formatting of the partition which does not affect the data of a user.

In addition, according to another feature of the present invention, physical abnormality can become appropriately detected by the automatic formatting of which the predetermined frequency is provided, and such a risk that the data of the user may be lost can be resolved in an early stage.

Further features of the present invention will become apparent from the following description of exemplary embodiments with reference to the attached drawings.

BRIEF DESCRIPTION OF THE DRAWINGS

FIG. 4 is a view illustrating a display example when abnormality has been detected in the hard disk.

DESCRIPTION OF THE EMBODIMENTS

Preferred embodiments of the present invention will now be described in detail in accordance with the accompanying drawings.

Figure 1:
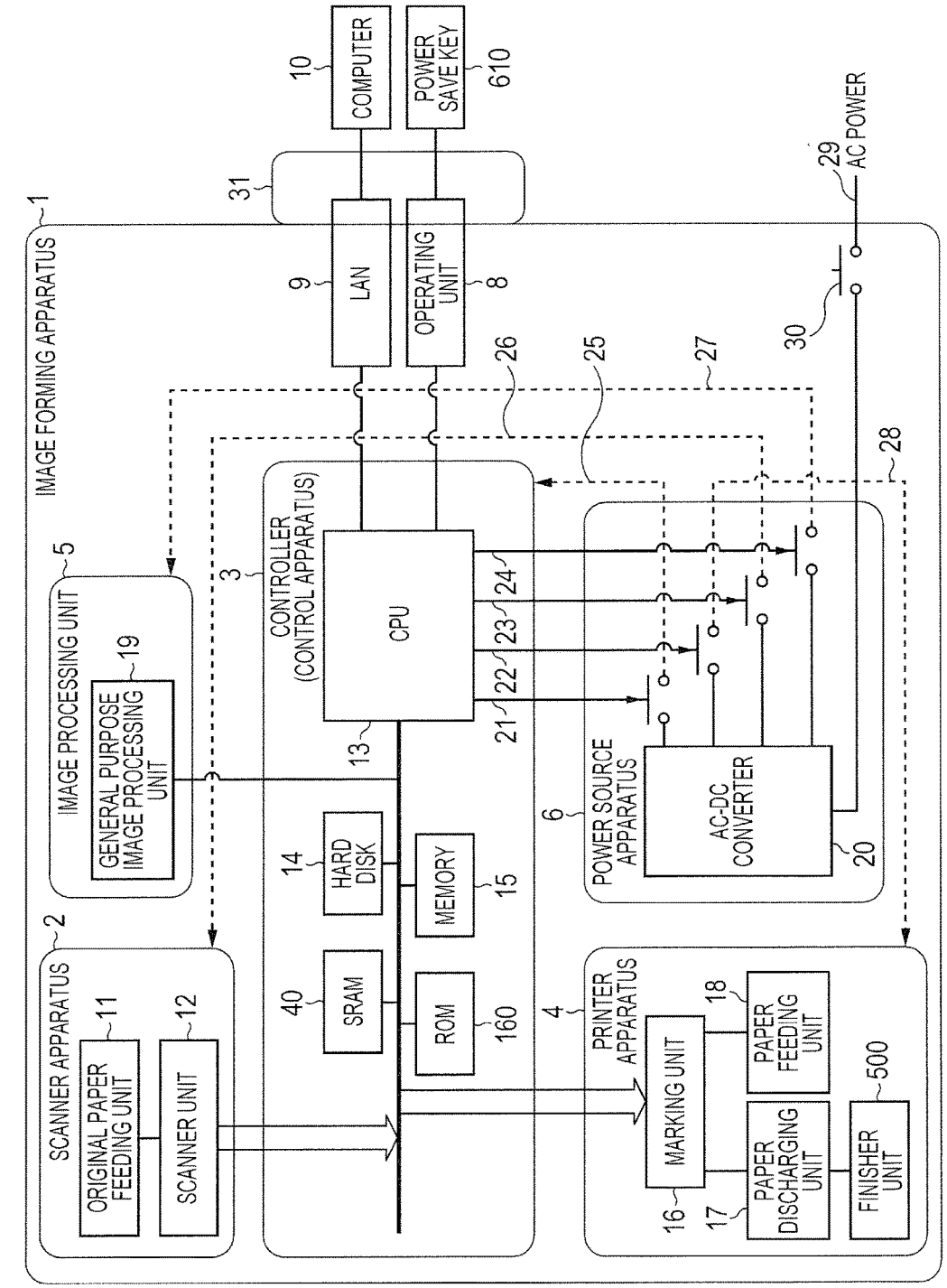
FIG. 1 is a block diagram illustrating a configuration example of an image forming apparatus according to an embodiment of the present invention.

FIG. 1 is a block diagram illustrating a configuration example of an image forming apparatus 1 of the present embodiment.

The image forming apparatus 1 has a scanner apparatus 2, a controller 3, a printer apparatus 4, an operating unit 8, a hard disk 14 and the like.

The scanner apparatus 2 is an engine which optically reads out an image from an original, and converts the read out image into a digital image. The printer apparatus 4 is an engine which outputs the digital image to a paper device. The operating unit 8 is a unit for performing an operation and display of the present apparatus. The hard disk 14 stores the digital image, a control program and the like therein. The controller 3 is connected to the above components, gives a direction to each module, and thereby enables jobs to be executed on the image forming apparatus.

A computer 10 can also input and output the digital image, issue the jobs and give a direction to equipment, on the image forming apparatus 1 through an LAN 9.

The scanner apparatus 2 includes an original paper feeding unit 11 which can automatically sequentially replace an original bundle, and a scanner unit 12 which can optically scan the original and convert the scanned data into the digital image. The converted image data is transmitted to the controller 3.

The printer apparatus 4 includes a paper feeding unit 18 which can sequentially feed paper from a paper bundle one by one, a marking unit 16 for printing the image data on the fed paper, a paper discharging unit 17 for discharging the paper on which the image has been printed, and a finisher unit 500 which subjects the discharged paper to post treatment.

The controller 3 has a CPU 13, transmits and receives the image data to and from the scanner apparatus 2 and the printer apparatus 4, and saves the image data. Specifically, the controller 3 temporarily saves the image data which the controller 3 has received from the scanner apparatus 2, in a memory 15. After that, the controller 3 stores the image data in the hard disk 14, and thereby achieves the scan and maintenance of the image.

The controller 3 temporarily saves the image data from the hard disk 14 in the memory 15, transmits the image data to the printer apparatus 4 from the memory 15, and thereby can output a print.

In addition, the image forming apparatus 1 has an image processing unit 5 which has a general purpose image processing unit 19, and can save the image data in the memory 15 again, which has been saved in the memory 15 and then has been subjected to processing, for instance, such as reduction in the general purpose image processing unit 19. The image forming apparatus 1 has the operating unit 8 which is controlled by the controller 3, makes the CPU 13 interpret the direction from the operation of an operator or the LAN 9, and can execute various jobs. In addition, the operating unit 8 can display a state of the job and also a state of the engine such as the scanner apparatus 2 and the printer apparatus 4.

An SRAM 40 is a non-volatile memory, and continuously holds data such as user setting, even after a power source has been turned OFF. In the present embodiment, the SRAM 40 is also used as a formatting frequency storage unit which stores the formatting frequency therein, and a formatting frequency upper limit storage unit which stores the upper limit of the frequency of formatting the partitions therein. A ROM 160 stores a program which is executed by the CPU 13 of the controller 3, but can also be used for the purpose of holding the set value, similarly to the SRAM 40.

A power source apparatus 6 is an apparatus which supplies an electric power to each unit which constitutes the image forming apparatus 1. When the image forming apparatus 1 is turned OFF, an AC power 29 is insulated from an AC-DC converter 20 by a switch 30. When the switch 30 is turned ON, the AC power 29 is supplied to the AC-DC converter 20, and the AC-DC converter 20 generates a DC power. The image forming apparatus 1 of the present embodiment is configured so that the whole apparatus can be controlled by four independent power lines, according to the direction of the CPU 13.

Specifically, the CPU 13 controls the switch 21, and thereby can control OFF/ON of the power source of an electric power 25 for a control unit. Similarly, a switch 22 can control OFF/ON of the power source of an electric power 28 for a printer unit, a switch 23 can control OFF/ON of the power source of an electric power 26 for the scanner apparatus, and a switch 24 can control OFF/ON of the power source of an electric power 27 for the general purpose image processing unit. The CPU 13 controls these switches 21 to 24, and thereby appropriately supplies the electric power to the necessary places of the image forming apparatus 1.

The state is a "sleep state", in which the image forming apparatus 1 lowers the electric power of itself as much as possible.

In the "sleep state", the image forming apparatus 1 controls a peripheral device of the CPU 13 to a general suspended state, passes an electric current only to a portion which can detect the job (electric power 31 for the sleeping time), and can control the electric power for the whole apparatus to a state of using an extremely small electric power.

Specifically, the CPU 13 saves the state of the apparatus in the memory 15, and turns off the power source of the electric power 25 for the control unit including the CPU 13 itself. At this time, the CPU 13 itself becomes unoperated, but a power saving key 610 turns the electric power 31 for the sleeping time ON through the hardware, and the CPU 13 becomes a state of understanding only that the job has come. Then, for instance, when a control command of the computer 10 has been sent from the LAN 9, or the operation of the operating unit 8 has been performed, the electric power 25 for the control unit is turned ON through the hardware.

Figure 2:
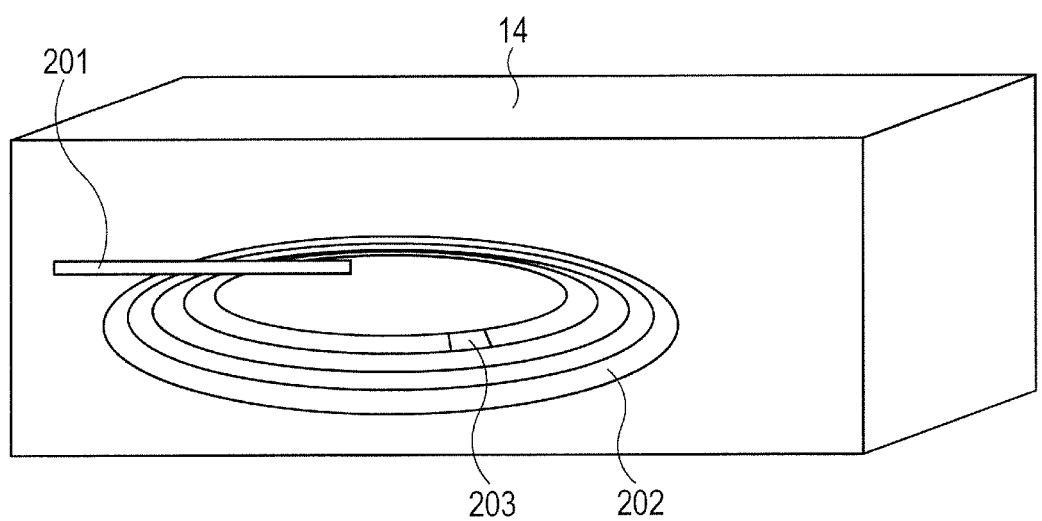
FIG. 2 is a view for describing a schematic configuration of a hard disk.

FIG. 2 is a view for describing a schematic configuration of the hard disk 14.

A magnetic head 201 is moved to a sector 203 of a magnetic disk 202, and reads out data. The hard disk 14 becomes an abnormal state by such factors that the sector 203 for reading and writing is shifted due to vibration given from the outside and environments such as a temperature and a humidity, and that the writing in the sector 203 is not normally completed due to the unintentional shutdown of the power source during writing.

Figure 3:
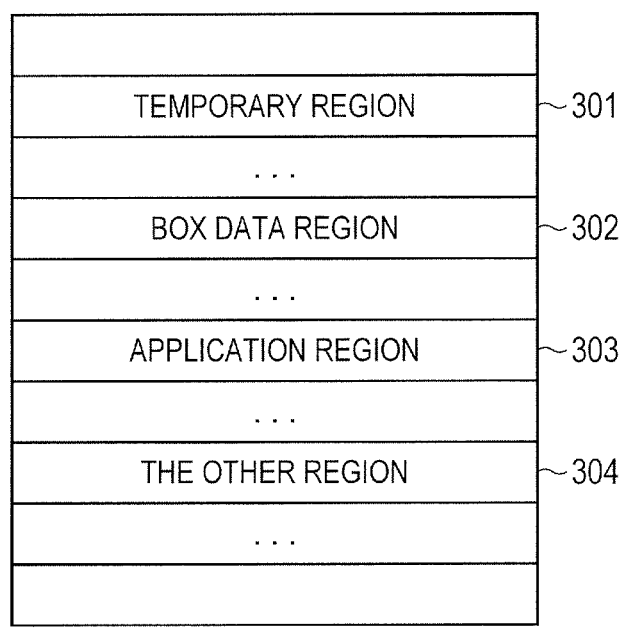
FIG. 3 is a view illustrating one example of a partition configuration in the inside of the hard disk.

FIG. 3 is a view illustrating one example of a partition configuration in the inside of the hard disk 14.

A temporary region 301 is a partition for holding data that is temporarily used at the time when the image forming apparatus 1 develops a compressed image, and the like. A BOX data region 302 is a partition which is used as a user data region that holds the data of a BOX function of printing and transmitting a stored scan image. An application region 303 is a partition which is used as a user data region for holding applications which a user installs later and can use. The other region 304 is a partition for holding, for instance, an execution program and a functional license.

FIG. 4 is a view illustrating an example of a display at the time when the abnormality of a hard disk 14 has been detected. When having detected the abnormality of the hard disk 14, the controller 3 displays a gist of promoting a user to turn a switch of a main power source on again, and an error cord 401 that indicates a region in which the abnormality has been detected, on an LCD 400, and notifies the occurrence of the abnormality. This is because when the abnormality of the hard disk 14 has occurred at the time of reading and has been detected, the hard disk 14 is occasionally restored by turning the switch of the main power source on again.

[First Embodiment]

Figure 5:
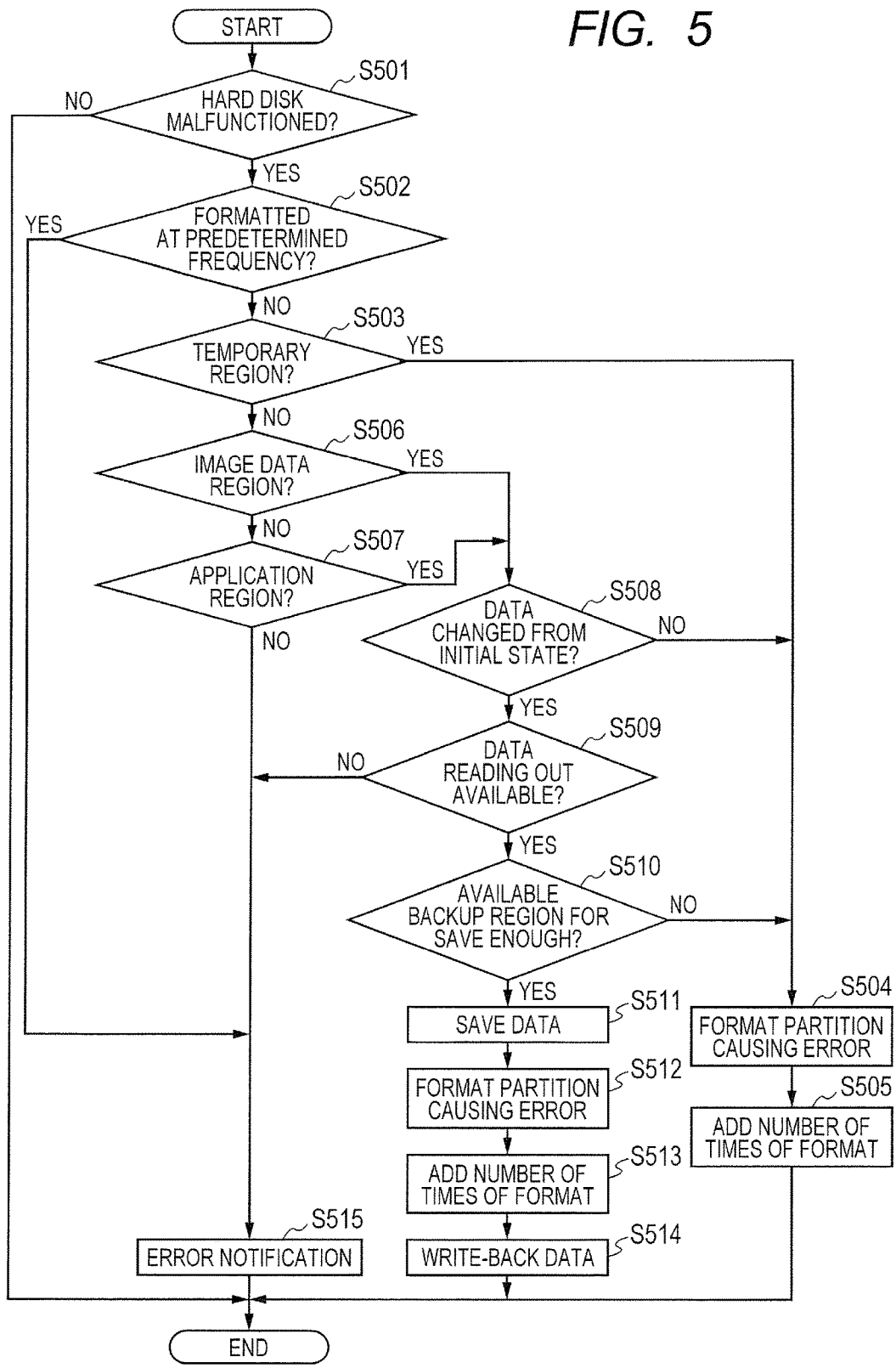
FIG. 5 is a flow chart for describing a flow of processing in the image forming apparatus according to the present embodiment.

The flow of the processes in the image forming apparatus 1 in the embodiment of the present invention will be described below with reference to a flow chart of FIG. 5. Each process in the present flow chart is achieved by the CPU 13 of the controller 3, which executes a program stored in the ROM 160.

In a step S501, the controller(data processing apparatus) 3 performs a hard disk malfunction detecting process of confirmation whether the malfunction(error) occurs in the hard disk 14, or not.

In a step S502, the controller 3 performs a formatting frequency confirmation process of confirmation whether a frequency of formatting the hard disk 14 has reached the upper limit of the frequency of formatting, or not. When the frequency of formatting is determined to have reached the upper limit, the process progresses to a step S515. At this time, the replacement of the hard disk by a serviceman is assumed as the countermeasure. When the frequency of formatting is determined not to reach the upper limit, the process progresses to a step S503.

In the step S503, the controller 3 performs a process of confirmation whether a malfunctioning portion is in a preliminary determined partition or not, here, performs a partition confirmation process of confirmation whether the malfunction-causing partition of the hard disk 14 is a temporary region 301 or not. When the malfunction-causing partition is determined to be the temporary region 301, the process progresses to a step S504. When the malfunction-causing partition is determined not to be the temporary region 301, the process progresses to a step S506.

In the step S504, the controller 3 performs a partition formatting process of formatting the malfunction-causing partition.

In a step S505, the controller 3 adds the number of the time of formatting. Then, the controller 3 performs a formatting frequency storage process of storing the added number of the time of formatting in the SRAM 40.

In the step S506, the controller 3 performs a partition confirmation process of confirmation whether the malfunction-causing partition of the hard disk 14 is a BOX data region 302 or not. When the malfunction-causing partition is determined to be the BOX data region 302, the process progresses to a step S508. When the malfunction-causing partition is determined not to be the BOX data region 302, the process progresses to a step S507.

In the step S507, the controller 3 performs a partition confirmation process of confirmation whether the malfunction-causing partition of the hard disk 14 is an application region 303 or not. When the malfunction-causing partition is determined to be the application region 303, the process progresses to the step S508. When the malfunction-causing partition is determined not to be the application region 303, the process progresses to a step S515. At this time, the malfunction-causing partition is the other region 304. Then, even the case is considered where the image forming apparatus does not normally start, and it is assumed that the hard disk is replaced by the serviceman.

In the step S508, the controller 3 performs a data updating confirmation process of confirmation whether data changed after an initial state exists in the malfunction-causing partition or not, specifically, confirmation whether data added or updated by user exists or not. In the BOX data region 302, such operations correspond to the change of the data that the user stores an image to be used in the BOX function and changes the name of a directory to be used in the BOX function. In addition, in the application region 303, such an operation corresponds to the change of the data that an application which the user can add later is installed. When the change of the data is determined to exist, the process progresses to a step S509. When the change of the data is determined not to exist, the process progresses to the step S504.

In the step S509, the controller 3 confirms whether the data can be read out or not. When the data is determined to be capable of being read out, the process progresses to a step S510. When the data is determined not to be capable of being read out, the process progresses to the step S515. At this time, it is assumed that the serviceman tells a gist that the data cannot be guaranteed to the user, and formats the malfunction-causing partition, on the consent of the user.

In the step S510, the controller 3 confirms whether an available region for saving read out data therein is sufficient or not. When an available capacity is determined to be sufficient, the process progresses to a step S511. When the available capacity is determined not to be sufficient, the process progresses to the step S504.

In the step S511, the controller 3 performs a data saving process of temporarily saving the data in the available region except for the partition including the malfunctioning portion. Specifically, the controller 3 saves the read out data in a memory 15.

In a step S512, the controller 3 formats the malfunction-causing partition.

In a step S513, the controller 3 adds the number of the time of formatting.

In a step S514, the controller 3 performs a data recovery process of writing data saved in the step S511 back into the read out partition, and recovers the data temporarily saved.

In the step S515, the controller 3 performs an error notification process of notifying the LCD 400 of an error.

The image forming apparatus which is configured as in the above described way can reduce the number of a dispatch of the serviceman, which is requested when the malfunction of a hard disk 14 has occurred that can be restored by the repower-up of a power source or the formatting of the partition which does not affect the data of the user.

In addition, the image forming apparatus 1 has a predetermined frequency of the automatic formatting provided therein, thereby is enabled to appropriately detect a physical abnormality of the hard disk 14, and can resolve such a risk that the data of the user may be lost, in an early stage. Incidentally, a place in which the data is saved in the step S511 is not limited to the memory 15, and may be the SRAM 40 and the ROM 160.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-139805, filed Jul. 7, 2014, which is hereby incorporated by reference herein in its entirety.

What is claimed is:

1. An image forming apparatus comprising:
at least one storage memory configured to store data, wherein plural logical storage partitions are defined in the storage memory, one of the partitions is configured to store a temporally data generated by the image forming program and another one of the partitions is configured to store data other than the temporally data generated by the image forming program;
a storage malfunction detecting unit configured to detect a malfunction of the storage memory;
a partition confirmation unit configured to confirm, when the malfunction of the storage memory is detected by the storage malfunction detecting unit, whether or not the malfunctioning portion of the storage memory is in the partition which is configured to store the temporally data generated by the image forming program; and
a partition formatting unit configured to format the partition for clearing a logical error in a file system in the partition upon a condition that it is confirmed by the partition confirmation unit that the malfunctioning portion of the storage memory detected by the storage malfunction detecting unit is in the partition which is configured to store the temporally data generated by the image forming program; and
a display control unit configured to control displaying an error notification on a display of the image forming apparatus without formatting the partition in which the malfunction is detected at least upon a condition that it is confirmed by the partition confirmation unit that the malfunctioning portion of the storage memory detected by the storage malfunction detecting unit is not in the partition which is configured to store the temporally data generated by the image forming program;
wherein the storage malfunction detecting unit, the partition confirmation unit, the partition formatting unit, and the display control unit are implemented by at least one computer.

2. The image forming apparatus according to claim 1, further comprising:
a data updating confirmation unit configured to confirm whether a partition of the storage memory includes data added or updated by a user, wherein
when the data added or updated by the user is included in a partition which is configured to store data related to an application, the data updating confirmation unit confirms that the data added or updated by the user is included in the partition of the storage memory, and
when the data added or updated by the user is determined not to be included in the partition of the storage memory in which the malfunction is detected, the partition formatting unit formats the partition.

3. The image forming apparatus according to claim 2, further comprising:
a data saving unit configured to save the data added or updated by the user temporarily in a location in the storage memory other than the partition including the malfunctioning portion to be formatted, and
a data recovery unit configured to recover the data saved by the data saving unit, wherein the data saving unit saves the data before the partition formatting unit formats the partition, and
the data recovery unit recovers the data, after the partition formatting unit formats the partition in which the malfunction is detected.

4. The image forming apparatus according to claim 1, further comprising:
a formatting counter in the storage memory configured to store a number of times of the formatting by the partition formatting unit,
wherein the formatting counter is managed with an upper limit of the number of times of formatting the partition, and
an error notification unit configured to notify an error when the number of times stored in the formatting counter reaches the upper limit.

5. A controlling method of an image forming apparatus that includes at least one storage memory configured to store data, wherein plural logical storage partitions are defined in the storage memory, one of the partitions is configured to store a temporally data generated by the image forming program and another one of the partitions is configured to store data other than the temporally data generated by the image forming program, the method comprising:
detecting a malfunction of the storage memory;
confirming, when the malfunction of the storage memory is detected in the detecting, whether or not the malfunctioning portion of the storage memory is in the partition which is configured to store the temporally data generated by the image forming program; and
formatting the partition for clearing a logical error in a file system in the partition, upon a condition that it is confirmed in the confirming that the malfunctioning portion of the storage memory detected in the detecting is in the partition which is configured to store the temporally data generated by the image forming program; and
controlling displaying an error notification on a display of the image forming apparatus without formatting the partition in which the malfunction is detected at least upon a condition that it is confirmed in the confirming that the malfunctioning portion of the storage memory detected by the detecting is not in the partition which is configured to store the temporally data generated by the image forming program, wherein the detecting, the confirming, the formatting, and the controlling displaying are implemented by at least one computer.

6. The controlling method according to claim 5, further comprising:

performing data updating confirmation to confirm whether a partition of the storage memory includes data added or updated by a user, wherein when the data added or updated by the user is included in a partition which is configured to store data related to an application, the data updating confirmation confirms that the data added or updated by the user is included in the partition of the storage memory, and when the data added or updated by the user is determined not to be included in the partition of the storage memory in which the malfunction is detected, the partition is formatted.

7. The controlling method according to claim 6, further comprising:

saving the data added or updated by the user temporarily in a location in the storage memory other than the partition including the malfunctioning portion to be formatted, and recovering the data saved in the data saving, wherein, in the saving, the data is saved before formatting the partition, and in the recovering, that data is recovered after the formatting of the partition in which the malfunction is detected.

8. The controlling method according to claim 5, further comprising:

formatting counter in the storage memory, to store a number of times of the formatting, wherein the formatting counter is managed with an upper limit of the number of times of formatting the partition, and an error is notified when the number of times stored in the formatting counter reaches the upper limit.

9. A non-transitory computer-readable recording medium storing a readable program for operating a computer to perform a controlling method of an image forming apparatus that at least one storage memory configured to store data, wherein plural logical storage partitions are defined in the storage memory, one of the partitions is configured to store a temporally data generated by the image forming program and another one of the partitions is configured to store data other than the temporally data generated by the image forming program, the method comprising;

detecting a malfunction of the storage memory;

confirming, when the malfunction of the storage memory is detected in the detecting, whether or not the malfunctioning portion of the storage memory is in the partition which is configured to store the temporally data generated by the image forming program; and formatting the partition for clearing a logical error in a file system in the partition, upon a condition that it is confirmed in the confirming that the malfunctioning portion of the storage memory detected in the detecting is in the partition which is configured to store the temporally data generated by the image forming program; and controlling displaying an error notification on a display of the image forming apparatus without formatting the partition in which the malfunction is detected at least upon a condition that it is confirmed in the confirming that the malfunctioning portion of the storage memory detected by the detecting is not in the partition which is configured to store the temporally data generated by the image forming program, wherein the detecting, the confirming, the formatting, and the controlling displaying are implemented by at least one computer.

10. The medium according to claim 9, wherein the method further comprises:

performing data updating confirmation to confirm whether a partition of the storage memory includes data added or updated by a user, wherein when the data added or updated by the user is included in a partition which is configured to store data related to an application, the data updating confirmation confirms that the data added or updated by the user is included in the partition of the storage memory, and when the data added or updated by the user is determined not to be included in the partition of the storage memory in which the malfunction is detected, the partition is formatted.

11. The medium according to claim 10, wherein the method further comprises:

saving the data added or updated by the user temporarily in a location in the storage memory other than the partition including the malfunctioning portion to be formatted, and recovering the data saved in the data saving, wherein, in the saving, the data is saved before formatting the partition, and in the recovering, that data is recovered after the formatting of the partition in which the malfunction is detected.

12. The medium according to claim 9, wherein the method further comprises:

formatting counter in the storage memory, to store a number of times of the formatting, wherein the formatting counter is managed with an upper limit of the number of times of formatting the partition, and an error is notified when the number of times stored in the formatting counter reaches the upper limit.

* * * * *